(12) United States Patent
Tokinoya et al.

(10) Patent No.: US 10,120,110 B2
(45) Date of Patent: Nov. 6, 2018

(54) WAVELENGTH CONVERSION SHEET, BACKLIGHT UNIT, AND PHOSPHOR PROTECTIVE FILM

(71) Applicant: TOPPAN PRINTING CO., LTD., Tokyo (JP)

(72) Inventors: Osamu Tokinoya, Tokyo (JP); Ikuno Higashi, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 15/282,333

(22) Filed: Sep. 30, 2016

(65) Prior Publication Data

US 2017/0017021 A1   Jan. 19, 2017

Related U.S. Application Data

(63) Continuation of application No. PCT/JP2015/060590, filed on Apr. 3, 2015.

(30) Foreign Application Priority Data

Apr. 4, 2014 (JP) ................................. 2014-077989
Apr. 4, 2014 (JP) ................................. 2014-077990

(51) Int. Cl.
| | | |
|---|---|---|
| *F21V 7/04* | (2006.01) | |
| *G02B 5/02* | (2006.01) | |
| *G02B 1/14* | (2015.01) | |
| *B32B 27/08* | (2006.01) | |
| *B32B 27/20* | (2006.01) | |
| *G02F 1/1335* | (2006.01) | |

(Continued)

(52) U.S. Cl.
CPC ............ *G02B 5/0226* (2013.01); *B32B 27/08* (2013.01); *B32B 27/20* (2013.01); *G02B 1/14* (2015.01); *G02B 6/005* (2013.01); *G02F 1/133617* (2013.01); *B32B 2255/10* (2013.01); *B32B 2255/26* (2013.01); *B32B 2457/202* (2013.01); *G02F 2202/36* (2013.01); *H01L 33/505* (2013.01)

(58) Field of Classification Search
CPC ......................................... G02F 2001/133614
USPC .................................................. 362/600–634
See application file for complete search history.

(56) References Cited

U.S. PATENT DOCUMENTS 9,631,793 B2 * 4/2017 Hikmet .................... F21V 9/16
2006/0255711 A1 * 11/2006 Dejima ................ G02B 6/0023
313/485

(Continued)

FOREIGN PATENT DOCUMENTS

| EP | 2 386 617 A1 | 11/2011 |
| EP | 2 730 610 A1 | 5/2014 |

(Continued)

OTHER PUBLICATIONS

International Search Report issued in International Patent Application No. PCT/JP2015/060590 dated Jun. 23, 2015.

(Continued)

*Primary Examiner* — William Carter
(74) *Attorney, Agent, or Firm* — Foley & Lardner LLP

(57) ABSTRACT

A wavelength conversion sheet includes a phosphor, and one or more barrier films that seal the phosphor. At least one of the barrier films includes a coating layer having an optical function. The coating layer is provided to a surface of the barrier film.

23 Claims, 8 Drawing Sheets

(51) Int. Cl.
*F21V 8/00* (2006.01)
*H01L 33/50* (2010.01)

(56) References Cited

U.S. PATENT DOCUMENTS

| | | | |
|---|---|---|---|
| 2010/0238381 A1* | 9/2010 | Oshima | G02F 1/133603 |
| | | | 359/326 |
| 2011/0037926 A1 | 2/2011 | Tsukahara et al. | |
| 2011/0273864 A1 | 11/2011 | Izawa et al. | |
| 2014/0124813 A1 | 5/2014 | Ito et al. | |
| 2014/0375929 A1* | 12/2014 | Boyd | G02F 1/133526 |
| | | | 362/606 |
| 2016/0061418 A1 | 3/2016 | Izawa et al. | |

FOREIGN PATENT DOCUMENTS

| | | |
|---|---|---|
| JP | H11-077946 A | 3/1999 |
| JP | 2009-018568 A | 1/2009 |
| JP | 2009-231273 A | 10/2009 |
| JP | 2009-283441 A | 12/2009 |
| JP | 2010-225373 A | 10/2010 |
| JP | 2011-013567 A | 1/2011 |
| JP | 2013-069726 A | 4/2013 |
| WO | WO-2013/005793 A1 | 1/2013 |

OTHER PUBLICATIONS

European Search Report dated Sep. 1, 2017 from related EP Application No. 15772969.0 (9 pages).

* cited by examiner

WAVELENGTH CONVERSION SHEET, BACKLIGHT UNIT, AND PHOSPHOR PROTECTIVE FILM

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2015/060590 filed on Apr. 3, 2015, which is based upon and claims the benefit of priority of Japanese Patent Application No. 2014-077989, filed on Apr. 4, 2014, and Japanese Patent Application No. 2014-077990, filed on Apr. 4, 2014, the entire contents of which are all hereby incorporated by reference.

TECHNICAL FIELD

The present invention relates to a wavelength conversion sheet, a backlight unit, and a phosphor protective film.

BACKGROUND

Liquid crystal displays are display devices that use liquid crystal compositions for display. Liquid crystal displays are used as display devices in a variety of devices, and specifically used as information display devices and image display devices.

Such a liquid crystal display forms an image by transmitting/intercepting light region by region according to an applied voltage. Therefore, external light is needed to form an image on the liquid crystal display. As a light source of the external light, a backlight provided on the back surface of the liquid crystal display is used. Backlights have conventionally been served by cold-cathode tubes. In these days, however, there are circumstances when light emitting diodes (LEDs) are used instead of cold-cathode tubes because of the long lives, good color producibility, or the like thereof In recent years, nano-size quantum dot phosphors are being commercialized under the initiative of overseas venture-capital organizations. Quantum dots are luminous semiconductor nanoparticles with a size in the range of 1 to 20 nm. The quantum dots with unique optical and electronic properties are on their way to being used in a large number of applications, such as flat panel displays, colorful illuminations (decorative lighting) and the like, in addition to the applications to fluorescence imaging in the fields of biology and medical diagnosis.

The white LED technique that is extremely important for displays typically uses a method of exciting cerium-doped YAG (yttrium aluminum garnet) down-conversion phosphors by using a blue (450 nm) LED chip. When blue light of an LED is mixed with yellow light of a wide wavelength range emitted from YAG phosphors, white light is produced. However, this white light is slightly bluish in many cases, and often taken to be cold or cool white light.

Quantum dots, which exhibit a wide excitation spectrum and have high quantum efficiency, are used as LED down-conversion phosphors (LED wavelength conversion phosphors). Moreover, only a change in the dot size or the type of the semiconductor material can fully adjust the wavelength of light emission throughout the visible range. Thus, quantum dots practically have a potential of producing any color, specifically a warm white color which has been strongly desired in the illumination industries. In addition to this, by combining three types of dots whose light emission wavelengths respectively correspond to red, green and blue, white lights with different color rendering indexes can be obtained. In this way, displays using backlights formed of quantum dots can improve hues to provide up to 65% of colors that can be recognized by persons, without increasing the thickness, power consumption, cost, the number of fabrication processes, and the like, compared with conventional liquid crystal TVs.

Such a backlight is formed by dispersing, inside a film, quantum dots having a light emission spectrum of red or green, and sealing both surfaces of the film with a barrier film or a laminate of barrier films. In some cases, the edge portions of the film are also sealed. The field of optical devices, for example, has been suffering from a problem of Newton's rings which are caused by members, such as a plastic film and a glass plate, which are in intimate contact with each other.

On the other hand, besides barrier properties, a barrier film used for sealing is required to have an appearance, transparency or the like conquering flaws or wrinkles. The term barrier film herein refers to a thin film that is formed on a surface of a base material, such as a plastic film, by vapor deposition or the like, and prevents gases or moisture from permeating therethrough. However, conventional barrier films have been served by those films which are used as packaging materials for foods, medical supplies, electronic devices and the like. Therefore, these barrier films can fail to provide satisfactory performance.

Thus, barrier films have suffered from splashes, foreign matters, or the like. The term splash herein refers to a phenomenon in which a material in the form of fine particles and at a high temperature to be vapor deposited scatters, or a phenomenon in which a material to be vapor deposited attaches to a base material and remains as foreign matters or makes a hole in the base material. In other words, barrier films for use in backlights have an issue of preventing the adverse effects of splashes and improving barrier properties.

Some methods can be proposed to cope with the above issue.

For example, Patent Literature 1 proposes an anti-Newton's ring sheet in which one surface or both surfaces of a member are roughened to prevent occurrence of Newton's rings. The roughening process as proposed includes sandblasting a surface of the member, or forming an anti-Newton's ring layer made of a binder component and fine particles on the member, or the like.

Patent Literature 2 proposes a backlight sandwiched between barrier films to prevent deterioration of the phosphors.

Patent Literature 3 proposes that an organic EL device is covered with a barrier film to ensure reliability of the organic EL device.

CITATION LIST

Patent Literature

Patent Literature 1: JP-A-H11-077946
Patent Literature 2: JP-A-2011-013567
Patent Literature 3: JP-A-2009-018568

SUMMARY OF THE INVENTION

Technical Problem

Referring to Patent Literature 1, a display was prepared, in which quantum dots were sealed with an existing barrier film. However, there was a problem that the luminance of the white LED lowered in a short while.

Referring to Patent Literatures 2 and 3, a display was prepared, in which quantum dots were sealed with an existing barrier film. However, there was a problem that the life of the obtained white light was shortened due to poor barrier properties, and fluctuations were caused in the white LED due to flaws and wrinkles of the film, or the quantum dot pattern, or the like. There was also a problem that, in the occurrence of splashes on the barrier film, defects were caused in the barrier film starting from the splashes, leading to a partial deterioration in luminance.

The present invention has been made in light of the circumstances stated above and has an object of providing a wavelength conversion sheet capable of attempting to prevent or preventing the occurrence of interference fringes and fluctuations in light from a light source, and a backlight unit including the sheet, providing a phosphor protective film having good barrier properties as a protective film for phosphors, and providing a wavelength conversion sheet and a backlight unit that can maximize the performance of quantum dots.

Solution to Problem

In order to solve the above problem, the present invention adopts the following configuration.

A wavelength conversion sheet according to a first aspect of the present invention includes: a phosphor, and one or more barrier films that seal the phosphor, wherein at least one of the barrier films includes a coating layer having an optical function, and the coating layer is provided to a surface of the barrier film.

The coating layer may prevent at least interference fringe.

The coating layer may include a binder resin layer and fine particles.

The fine particles may be at least either organic particles or inorganic particles.

An average particle size of the fine particles may be in a range of 0.5 to 30 μm.

At least one of the barrier films may include one or more base materials, one or more barrier layers, and the coating layer.

The barrier layer may include an inorganic thin film layer laminated on one surface of the base material, and a gas barrier cover layer laminated on the inorganic thin film layer.

The barrier layer may include a first inorganic thin film layer laminated on one surface of the base material, a first gas barrier cover layer laminated on the first inorganic thin film layer, a second inorganic thin film layer laminated on the first gas barrier cover layer, and a second gas barrier cover layer laminated on the second inorganic thin film layer.

The base material may be a polyethylene terephthalate film having an acid value of 25 or less.

The barrier film including the coating layer may have a total light transmittance of 85% or more.

A backlight unit according to a second aspect of the present invention includes a light emitting device formed of a blue LED, and the wavelength conversion sheet according to the aspect set forth above disposed on the light emitting device.

A phosphor protective film that protects quantum dot phosphors, according to a third aspect of the present invention includes: one or more barrier films each including a first base material, and one or more barrier layers provided on at least one surface of the first base material; and one or more plastic films each including a second base material, wherein the barrier film and the plastic film are laminated so that the barrier layer is sandwiched between the first base material and the second base material.

The barrier layer may include an inorganic thin film layer laminated on one surface of the first base material, and a gas barrier cover layer laminated on the inorganic thin film layer.

The barrier layer may include a first inorganic thin film layer laminated on one surface of the first base material, a first gas barrier cover layer laminated on the first inorganic thin film layer, a second inorganic thin film layer laminated on the first gas barrier cover layer, and a second gas barrier cover layer laminated on the second inorganic thin film layer.

The barrier film and the plastic film may be bonded and laminated to each other by use of any of an acrylic resin tackifier, a urethane adhesive, and an ester adhesive.

At least one of the barrier film and the plastic film may have a coating layer that improves optical properties; and the coating layer may be provided to a surface of the phosphor protective film.

The first base material may be a polyethylene terephthalate film having an acid value of 25 or less.

The gas barrier cover layer may contain at least one or more members of a hydroxyl group-containing polymer compound, a metal alkoxide, a metal alkoxide hydrolysate, and a metal alkoxide polymer.

A wavelength conversion sheet according to a fourth aspect of the present invention includes: a phosphor layer that contains quantum dot phosphors, and one or more of the phosphor protective films according to the aspect set forth above laminated on at least one surface of the phosphor layer.

The phosphor protective film may be laminated so that the first base material of the barrier film faces the phosphor layer.

The phosphor protective film may include a coating layer that improves optical properties; and the coating layer may be provided on a surface of the plastic film, the surface of the plastic film being opposite to a surface that faces the phosphor layer.

The phosphor protective film may be laminated so that the plastic film faces the phosphor layer.

The phosphor protective film may include a coating layer having an optical function; and the coating layer may be provided on a surface of the barrier film, the surface of the barrier film being opposite to a surface that faces the phosphor layer.

A backlight unit according to a fifth aspect of the present invention includes a light source, a light guide plate, and the wavelength conversion sheet according to the aspect set forth above.

Advantageous Effects of the Invention

In the wavelength conversion sheet according the above aspect of the present invention, at least one of the barrier films laminated on the phosphor layer includes a coating layer having an optical function, and the coating layer is provided on a surface of the barrier film. Accordingly, the occurrence of interference fringes can be reduced or even minimized, and fluctuations in light from a light source can be reduced or even minimized.

The phosphor protective film according to the above aspect of the present invention is a laminated film in which the barrier film and the plastic film are laminated so as to sandwich the barrier layer between the first and second base materials. Thus, the phosphor protective film can minimize the adverse effects of splashes, and accordingly exhibit good barrier properties. When the coating layer is provided on a surface of the phosphor protective film, the occurrence of interference fringes can be minimized, and fluctuations in light from a light source can be minimized.

In the wavelength conversion sheet according to the above aspect of the present invention, the phosphor layer that contains quantum dot phosphors is laminated to the phosphor protective film and sealed. Accordingly, the wavelength conversion sheet exerts good barrier properties, and thus the performance of quantum dots is increased or even maximally exerted.

The backlight unit according to the above aspects of the present invention includes the wavelength conversion sheet. Accordingly, there is provided a display which exhibits rich colors closer to natural colors with a good hue without any defects or fluctuations.

DESCRIPTION OF REPRESENTATIVE EMBODIMENTS

Figure 1:
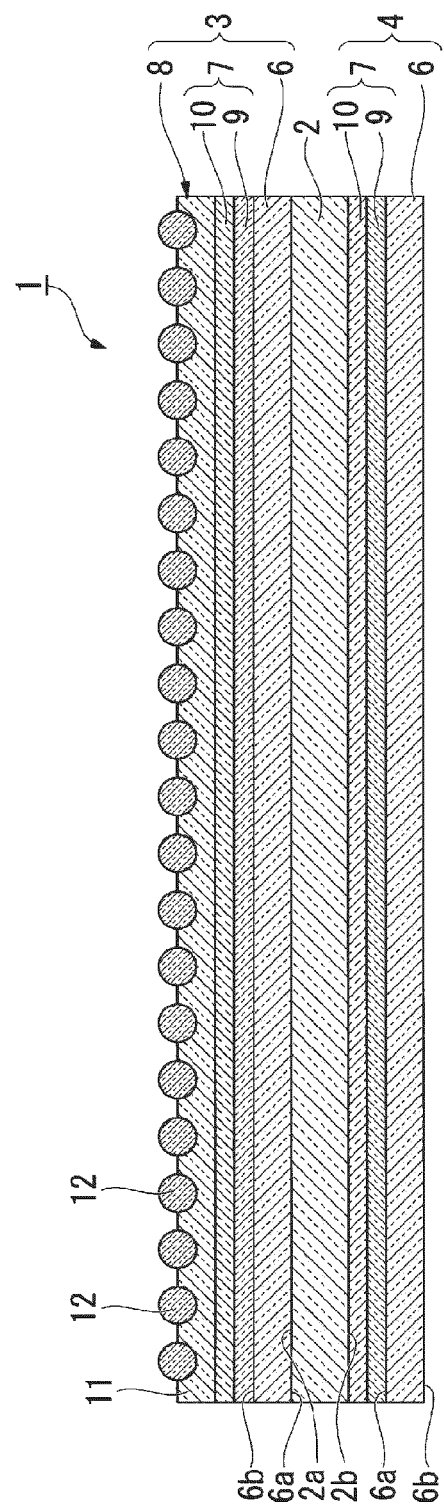
FIG. 1 is a schematic cross-sectional view illustrating a configuration of a wavelength conversion sheet according to a first embodiment of the present invention.

Referring to the drawings, hereinafter will be specifically described a wavelength conversion sheet, a phosphor protective film configuring a wavelength conversion sheet, and a backlight unit including a wavelength conversion sheet, according to several embodiments of the present invention. The wavelength conversion sheet according to each embodiment below includes quantum dot phosphors which can be used in a backlight unit as phosphors for LED wavelength conversion.

In the drawings referred to in the following description, for clarity, characteristic parts are sometimes enlarged and thus the components are not necessarily illustrated to scale. It is to be understood that the drawings and descriptions below are representative of the invention and that the invention is not necessarily limited to the drawings and descriptions herein.

First Embodiment

First, a wavelength conversion sheet 1 according to a first embodiment of the present invention will be described. FIG. 1 is a schematic cross-sectional view illustrating a configuration of the wavelength conversion sheet 1.

As shown in FIG. 1, the wavelength conversion sheet 1 includes a quantum dot phosphor layer (the phosphor) 2, a first barrier film (the barrier film) 3 provided on a surface 2a of the phosphor layer 2, and a second barrier film 4 provided on the surface 2b of the phosphor layer 2. More specifically, the first and second barrier films 3 and 4 directly cover the two surfaces 2a and 2b of the phosphor layer 2, or cover them through a sealing resin layer 5 (not shown in FIG. 1, see FIG. 5). Thus, there is provided a structure in which the phosphor layer 2 is wrapped (i.e., sealed) between the first and second barrier films 3 and 4.

(Phosphor Layer)

Typically, a backlight unit is configured of a light guide plate and an LED light source. The LED light source is disposed on the side surface of the light guide plate. Inside the LED light source, a plurality of LED elements emitting blue light are provided. The LED elements may be violet LEDs, or may be LEDs with shorter wavelength. The LED light source emits light toward the side surface of the light guide plate. In the case of a backlight unit using quantum dots, the emitted light passes through a light guide plate and enters the layer (phosphor layer) 2 in which a resin, such as epoxy, is mixed with phosphors. Therefore, the phosphor layer 2, which is required to be imparted with barrier properties, desirably has a configuration of being sandwiched between the first barrier film and the second barrier film 4, or between protective films described later.

The phosphor layer 2 is a thin film made of a resin or the like with a thickness of dozens to hundreds of micrometers. Resins that can be used include, for example, a photosensitive resin or a thermosetting resin. Inside the resin, two types of phosphors formed of quantum dots are sealed, being mixed. The phosphor layer 2 may be formed by laminating two or more layers in each of which only one type of phosphors is sealed. For the phosphors, those which having the same excitation wavelength are selected. The excitation wavelength of phosphors is selected based on the wavelength of light emitted from the LED light source. The two types of phosphors exhibit fluorescent colors different from each other. The fluorescent colors are red and green. The wavelength of each type of phosphors and the wavelength of the light emitted from the LED light source are selected based on the spectral characteristics of color filters. The peak wavelengths of the phosphors are 610 nm for red and 550 nm for green, for example.

Next, the particle structure of the phosphors contained in the phosphor layer 2 will be described. Preferably used phosphors include, in particular, core-shell quantum dots having good luminous efficiency. In the core-shell quantum dots, a semiconductor crystal core as a light emitting part is coated with a shell as a protective film. Examples of materials used for the core include cadmium selenide (CdSe), and examples of materials used for the shell include zinc sulfide (ZnS). When surface imperfection of the CdSe particles are coated with ZnS having a large band gap, quantum yield is improved. The phosphors may be formed with the cores thereof being double-coated with a first shell and a second shell. For the core, CdSe can be used. For the first shell, zinc selenide (ZnSe) can be used, and for the second shell, ZnS can be used.

In the phosphor layer 2, phosphors that convert light emitted from the light source into red, green, or the like may be dispersed in a single layer, or may be laminated in the form of separate layers to form a multilayer of phosphors.

(First Barrier Film)

The first barrier film 3 includes a base material 6, a barrier layer 7, and a coating layer 8. As shown in FIG. 1, in the wavelength conversion sheet 1, the first barrier film 3 is disposed in such a manner that surface 6a of the base material 6 faces (adheres to) the surface 2a of the phosphor layer 2. The barrier layer 7 and the coating layer 8 are laminated in this order on the surface 6b of the base material 6.

Preferably used materials for the film of the base material 6 include, but are not limited to, polyethylene terephthalate and polyethylene naphthalate. Particularly preferably used materials for the film of the base material 6 include polyethylene terephthalate having an acid value of 25 or less. The acid value is a milligram value of potassium hydroxide needed to neutralize free fatty acid and other acidic substances contained per 1 gram of fats and oils, such as a fat, an oil or a wax. If the acid value of the base material 6 exceeds 25, stability of the base material is impaired under a high-temperature high-humidity environment, in particular, and thus the barrier properties can be deteriorated, which is not preferable. On the other hand, when the acid value is 25 or less, stability of the base material increases, and thus the barrier properties may not be deteriorated under a high-temperature high-humidity environment, which is preferable.

The barrier layer 7 includes an inorganic thin film layer 9 and a gas barrier cover layer 10. As shown in FIG. 1, the barrier layer 7 is configured such that the inorganic thin film layer 9 is laminated on the surface 6b of the base material 6, and the gas barrier cover layer 10 is laminated on the inorganic thin film layer 9.

Examples of materials that can be used as the inorganic thin film layer (inorganic oxide thin film layer) 9 include, but are not particularly limited to, aluminum oxide, silicon oxide, magnesium oxide, and a mixture thereof. Among them, from the viewpoint of barrier properties and productivity, aluminum oxide or silicon oxide is desirably used. Moreover, from the viewpoint of moisture barrier properties, silicon oxide is particularly desirably used.

The thickness (film thickness) of the inorganic thin film layer 9 is preferably in the range of 10 to 500 nm, and more preferably in the range of 50 to 300 nm. If the film thickness is less than 10 nm, the film thickness will be too thin to obtain a uniform film or to sufficiently exert the function as a gas barrier material, which is not preferable. On the other hand, if the film thickness exceeds 500 nm, the thin film fails to retain flexibility, and there is a risk of causing cracks in the thin film after being formed, due to external factors, such as bending, pulling, or the like, which is not preferable.

The gas barrier cover layer 10 is provided to prevent various secondary wears and tears in the post processing and to impart highly reliable barrier properties. Material as components of the gas barrier cover layer 10 include at least one member from a hydroxyl group-containing polymer compound, metal alkoxide, metal alkoxide hydrolysate, and metal alkoxide polymer.

Specifically, examples of the hydroxyl group-containing polymer compound include water-soluble polymers, such as polyvinyl alcohol, polyvinyl pyrrolidone, and starch. In particular, use of polyvinyl alcohol can achieve the best barrier properties.

The metal alkoxide is a compound that can be expressed by a general formula, $M(OR)_n$, where M is a metal, such as Si, Ti, Al, or Zr, and R is an alkyl group, such as $CH_3$ and $C_2H_5$. The metal alkoxide specifically includes tetraethoxysilane[$Si(OC_2H_5)_4$], triisopropoxyaluminium [$Al(O\text{-}iso\text{-}C_3H_7)_3$], or the like. Among them, tetraethoxysilane and triisopropoxyaluminium are preferable for the material of the gas barrier cover layer 10, because they are comparatively stable in an aqueous solvent after being hydrolyzed. Examples of hydrolysates or polymers include silicic acid ($Si(OH)_4$) and the like as hydrolysates and polymers of tetraethoxysilane. Hydrolysates or polymers of trispropoxyaluminum include aluminum hydroxide ($Al(OH)_3$), and the like.

To decompose the metal alkoxide, a catalyst, such as tin chloride, may be added to the gas barrier cover layer 10. For example, the catalyst may be stannous chloride, stannic chloride, or a mixture of them, or may be an anhydride or hydrate.

The coating layer 8 is provided on the surface of the first barrier film 3, i.e., the surface of the wavelength conversion sheet 1, to exert one or more optical functions. The optical functions include, but are not limited to, interference fringe (Moire) prevention, anti-reflection, diffusion, and the like. In the wavelength conversion sheet 1 according to the present embodiment, the coating layer is characterized at least by its interference fringe prevention function.

As shown in FIG. 1, the coating layer 8 is configured to include a binder resin layer 11 and fine particles 12. The fine particles 12 are buried so as to be partially exposed from the surface of the binder resin layer 11. Thus, micro irregularities are produced on the surface of the coating layer 8. The coating layer 8 is provided in this way on the surface of the first barrier film 3, i.e., on the surface of the wavelength conversion sheet 1, thereby preventing occurrence of Newton's rings.

Examples of materials used for the binder resin layer 11 specifically include a thermoplastic resin, a thermosetting resin, and an ultraviolet curing resin.

Usable materials for the thermoplastic resin include: cellulose derivatives, such as acetylcellulose, nitrocellulose, acetylbutylcellulose, ethyl cellulose, and methylcellulose; vinyl resins, such as vinyl acetate and a copolymer thereof, vinyl chloride and a copolymer thereof, and vinylidene chloride and a copolymer thereof; acetal resins, such as polyvinyl formal, and polyvinyl butyral; acrylic resins, such as acrylic resin and a copolymer thereof, and methacrylic resin and a copolymer thereof; a polystyrene resin; a polyamide resin; a linear polyester resin; a fluorine resin; and a polycarbonate resin.

The thermosetting resin includes a phenol resin, a urea melamine resin, a polyester resin, a silicone resin, or the like.

The ultraviolet curing resin includes a photopolymerizable prepolymer, such as an epoxy acrylate, urethane acrylate, polyester acrylate, or the like. Alternatively, an ultraviolet curing resin can also be configured by using the above photopolymerizable prepolymer as a base resin, and a monofunctional or polyfunctional monomer as a diluent.

The thickness (film thickness) of the binder resin layer 11 is preferably in the range of 0.1 to 20 μm, and specifically preferably in the range of 0.3 to 10 μm. If the film thickness of the binder resin layer 11 is less than 0.1 μm, the film thickness is so thin that a uniform film is not necessarily obtained, or sufficient optical functions are not necessarily exerted, which is not preferable. On the other hand, if the film thickness exceeds 20 μm, the fine particles 12 do not appear onto the surface of the coating layer 8 and the effect of imparting irregularities is unlikely to be exerted, or transparency is deteriorated, or such a thick film does not conform to the trend of reducing the thickness of displays if only a little, which is not preferable.

Usable materials for the fine particles 12 specifically include, for example, organic particles and inorganic particles. These materials may be used singly or in combination of two or more.

The organic particles include spherical acrylic resin fine powder, ethylene tetrafluoride resin fine powder, cross-linked polystyrene resin fine powder, polyurethane resin fine powder, polyethylene resin fine powder, benzoguanamine resin fine powder, silicone resin fine powder, epoxy resin fine powder, or the like.

The inorganic particles include silica particles, zirconia particles, or the like.

The fine particles 12 preferably have an average primary particle size in the range of 0.5 to 30 μm. In the present embodiment, the average primary particle size is measured by laser diffractometry. If the average particle size of the fine particles 12 is less than 0.5 μm, the effect of imparting irregularities to the surface of the coating layer 8 is not obtained, which is not preferable. On the other hand, if the average particle size exceeds 30 μm, it means to use particles with a size much larger than the thickness of the coating film, resulting in lowering of the transmittance, which is not preferable. In contrast to this, when the average particle size is in the above range, irregularities can be imparted to the surface, with high transmittance of light being maintained.

In the entire configuration including the coating layer 8, the total light transmittance of the first barrier film 3 is preferably 85% or more. If the total light transmittance of the first barrier film 3 including the coating layer 8 is less than 85%, loss of light emitted from the light source is increased and sufficient brightness is not ensured on the display, or a brighter light source has to be used to ensure brightness, which is not preferable. In contrast to this, when the total light transmittance is 85% or more, brightness on the display is ensured with less electric power, which is preferable.

Using the first barrier film 3 thus configured as a component of the wavelength conversion sheet 1, the performance of the phosphor layer 2 using quantum dots is increased or even maximally exerted. Moreover, the occurrence of interference fringes, such as Newton's rings, can be lowered or even prevented, resultantly achieving a display of high efficiency, high definition, and long life.

(Second Barrier Film)

The second barrier film 4 includes a base material 6 and a barrier layer 7, and is different in configuration from the first barrier film 3 in that the coating layer 8 is not provided. More specifically, as shown in FIG. 1, in the wavelength conversion sheet 1, the second barrier film 4 is disposed in such a manner that surface 6a of the base material 6 faces the surface 2b of the phosphor layer 2. Further, an inorganic thin film layer 9 is laminated on the surface 6a of the base material 6, and a gas barrier cover layer 10 is laminated on the inorganic thin film layer 9. The inorganic thin film layer 9 and the gas barrier cover layer 10 configure the barrier layer 7. In other words, the surface 2b of the phosphor layer 2 is in contact with the gas barrier cover layer 10 of the second barrier film 4.

Specifically, the second barrier film 4 is different from the first barrier film 3 in that the barrier layer 7 is laminated to a surface facing the phosphor layer 2 and that the coating layer 8 is not provided on the surface 6b opposite to the phosphor layer 2 side. A configuration similar to the one described on the first barrier film 3 can be applied to the configuration of the base material 6 and the barrier layer 7.

The following description addresses a method of fabricating the wavelength conversion sheet 1 according to the present embodiment.

For example, in the method of fabricating the wavelength conversion sheet 1, the phosphor layer 2 can be laminated between the first barrier film 3 and the second barrier film 4 by the following procedure.

(Fabrication Process of the First and Second Barrier Films)

In the fabrication of the first and second barrier films 3 and 4, first, the inorganic thin film layer 9 is laminated on at least one surface of the base material 6 by vapor deposition or the like, for example. Then, a coating agent is applied onto the surface of the inorganic thin film layer 9 to form the gas barrier cover layer 10. The coating agent is obtained by preparing an aqueous solution or water/alcohol mixture solution containing as base resin a water-soluble polymer (hydroxyl group-containing polymer compound) and at least either (a) one or more metal alkoxides and hydrolysates or (b) tin chloride. Thus, the second barrier film 4 with the barrier layer 7 being provided on the base material 6 is obtained.

On the other hand, for the first barrier film 3, the coating layer 8 is further formed on the barrier layer 7 provided on the base material 6. Specifically, the coating layer 8 is formed by applying a coating liquid, which is a mixture of a binder resin and fine particles, onto the barrier layer 7. Thus, the first barrier film with the barrier layer 7 and the coating layer 8 being laminated on the base material 6 is obtained.

(Fabrication Process of Phosphor Layer and Lamination Process of Barrier Film)

The method of forming the phosphor layer 2 is not specifically limited. For example, the method includes, as described in JP-A-2013-544018, dispersing a phosphor material in a binder resin, such as a photosensitive resin or a thermosetting resin, coating the prepared mixed solution onto the first barrier film 3 or the second barrier film 4, followed by UV curing or thermosetting, for sealing.

As the photosensitive resin and the thermosetting resin, an acrylic resin, an epoxy resin, and a polyolefin resin can be mentioned.

In the present embodiment, the fabrication process of the phosphor layer 2 and the lamination process of the barrier film are not specifically limited to the above methods. For example, the second barrier film 4 may be laminated on the phosphor layer 2 after forming the phosphor layer 2 on the surface 6a of the base material 6 of the first barrier film 3.

As described above, in the wavelength conversion sheet 1 of the present embodiment, one barrier film (first barrier film 3) laminated on the phosphor layer 2 includes the coating layer 8 having an optical function. The coating layer 8 is provided on a surface of the first barrier film 3. Accordingly, the occurrence of interference fringes, such as Newton's rings, can be reduced, and fluctuations in light from the light source can be reduced.

The wavelength conversion sheet 1 of the present embodiment uses the first and second barrier films 3 and 4 having good barrier properties and high transparency, thereby providing a backlight unit for display that maximizes the performance of the quantum dots.

Moreover, the wavelength conversion sheet 1 of the present embodiment, which uses the first and second barrier films 3 and 4 having good barrier properties and high transparency, can provide a display that exhibits rich colors closer to natural colors with a good hue.

Second Embodiment

Figure 2:
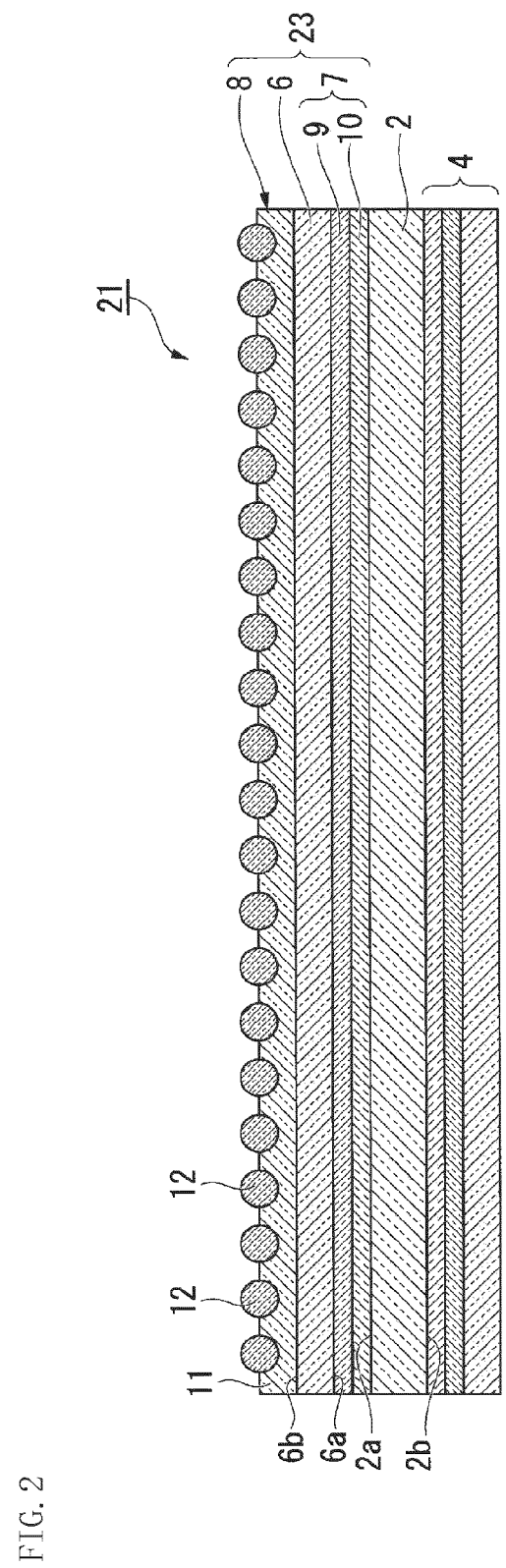
FIG. 2 is a schematic cross-sectional view illustrating a configuration of a wavelength conversion sheet according to a second embodiment of the present invention.

Referring now to FIG. 2, a wavelength conversion sheet 21 according to a second embodiment of the present invention will be described. When compared with the wavelength conversion sheet 1 of the first embodiment, the wavelength conversion sheet 21 is different only in the configuration of a first barrier film. Therefore, in the wavelength conversion sheet 21 of the present embodiment, components that are the same as those of the wavelength conversion sheet 1 of the first embodiment are designated with the same reference signs to omit duplicate description.

As shown in FIG. 2, the wavelength conversion sheet 21 includes a phosphor layer (phosphor) 2, a first barrier film (barrier film) 23 provided on the surface 2a side of the phosphor layer 2, and a second barrier film 4 provided on the surface 2b side of the phosphor layer 2. More specifically, the first barrier film 23 and the second barrier film 4 are laminated directly on the two surfaces 2a and 2b, respectively, of the phosphor layer 2, or via a sealing resin layer 5 (not shown in FIG. 2, see FIG. 5). Thus, there is provided a structure is in which the phosphor layer 2 is wrapped (i.e., sealed) between the first barrier film 23 and the second barrier film 4.

(First Barrier Film)

The first barrier film 23 includes a base material 6, a barrier layer 7, and a coating layer 8. As shown in FIG. 2, in the first barrier film 23, the barrier layer 7 is laminated on the surface 6a of the base material 6 facing the surface 2a of the phosphor layer 2. The coating layer 8 is laminated on the surface 6b of the base material 6. In other words, the first barrier film 23 of the present embodiment is different from the first barrier film 3 of the first embodiment in that the barrier layer 7 (gas barrier cover layer 10) of the first barrier film 23 is provided so as to face (to contact) the phosphor layer 2 and that the coating layer 8 is provided on the surface 6b opposite to the phosphor layer 2 side.

As described above, the wavelength conversion sheet 21 of the present embodiment can provide advantageous effects similar to those of the wavelength conversion sheet 1 of the first embodiment.

In the wavelength conversion sheet 21 of the present embodiment, the barrier layer 7 configuring the first barrier film 23 is provided so as to face (contact) the phosphor layer 2. Accordingly, the barrier performance can be more effectively exerted.

Third Embodiment

Figure 3:
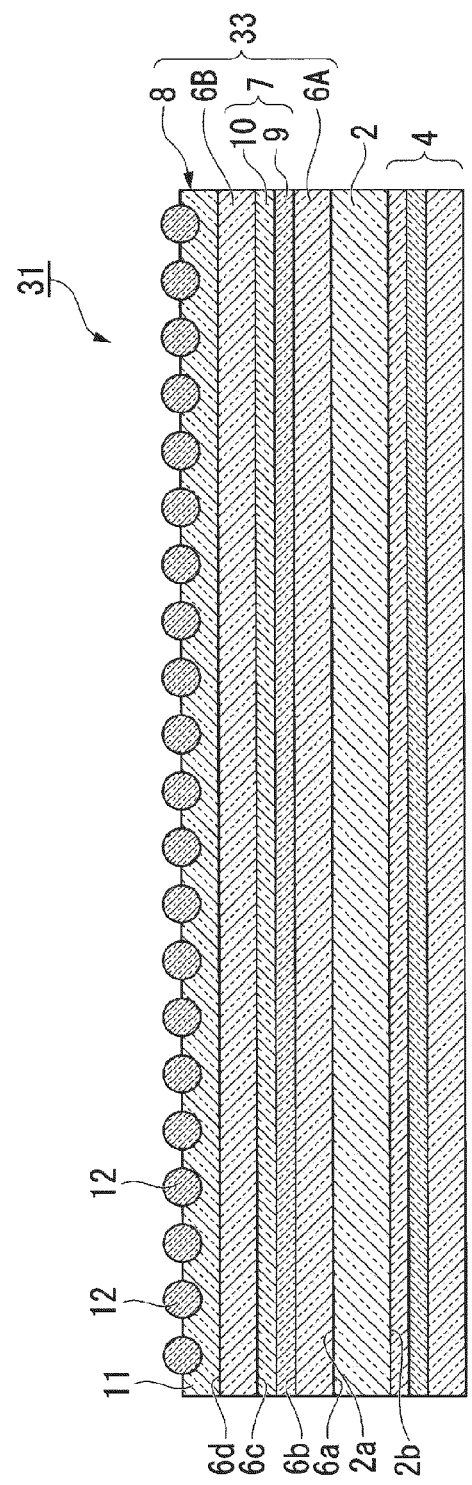
FIG. 3 is a schematic cross-sectional view illustrating a configuration of a wavelength conversion sheet according to a third embodiment of the present invention.

Referring to FIG. 3, a wavelength conversion sheet 31 according to a third embodiment of the present invention will be described. In the present embodiment, the wavelength conversion sheet 31 is different from the wavelength conversion sheets 1 and 21 of the first and second embodiments only in the configuration of the first barrier film. Therefore, in the wavelength conversion sheet of the present embodiment, components that are the same as those of the first and second embodiments are designated with the same reference signs to omit duplicate description As shown in FIG. 3, the wavelength conversion sheet 31 of the present embodiment includes a phosphor layer (phosphor) 2, a first barrier film (barrier film) 33 provided on the surface 2a of the phosphor layer 2, and a second barrier film 4 provided on the surface 2b of the phosphor layer 2. More specifically, the two surfaces 2a and 2b of the phosphor layer 2 are covered with the first barrier film 33 and the second barrier film 4, respectively, directly, or via a sealing resin layer 5 (not shown in FIG. 3, see FIG. 5). Thus, there is formed a structure in which the phosphor layer 2 is wrapped (i.e., sealed) between the first barrier film 33 and the second barrier film 4.

(First Barrier Film)

The first barrier film 33 has first and second base materials 6A and 6B, a barrier layer 7, and a coating layer 8. As shown in FIG. 3, in the first barrier film 33, the surface 6a of the first base material 6A faces (contacts) the surface 2a of the phosphor layer 2. Further, the barrier layer 7 and the second base material 6B are laminated in this order on the surface 6b of the first base material 6A. In other words, the barrier layer 7 is sandwiched between the surface 6b of the first base material 6A and a surface 6c of the second base material 6B. In the present embodiment, the inorganic thin film layer 9 of the barrier layer 7 is in contact with the base material 6A, while the gas barrier cover layer 10 is in contact with the base material 6B. Moreover, the coating layer 8 is laminated on a surface 6d of the second base material 6B. In other words, the configuration of the first barrier film 33 of the present embodiment is different from those of the first barrier films 3 and 23 of the first and second embodiments in that the first base material 6A is provided so as to face (contact) the phosphor layer 2 and that the barrier layer 7, the second base material 6B, and the coating layer 8 are laminated on the first base material 6A.

As described above, the wavelength conversion sheet 31 of the present embodiment can provide advantageous effects similar to those of the wavelength conversion sheets 1 and 21 of the first and second embodiments.

In the wavelength conversion sheet 31 of the present embodiment, the barrier layer 7 configuring the first barrier film 33 is sandwiched between the first and second base materials 6A and 6B. Accordingly, if any defect, such as micro pin holes, is caused on the barrier layer 7, the barrier performance is more effectively exerted.

Fourth Embodiment

Figure 4:
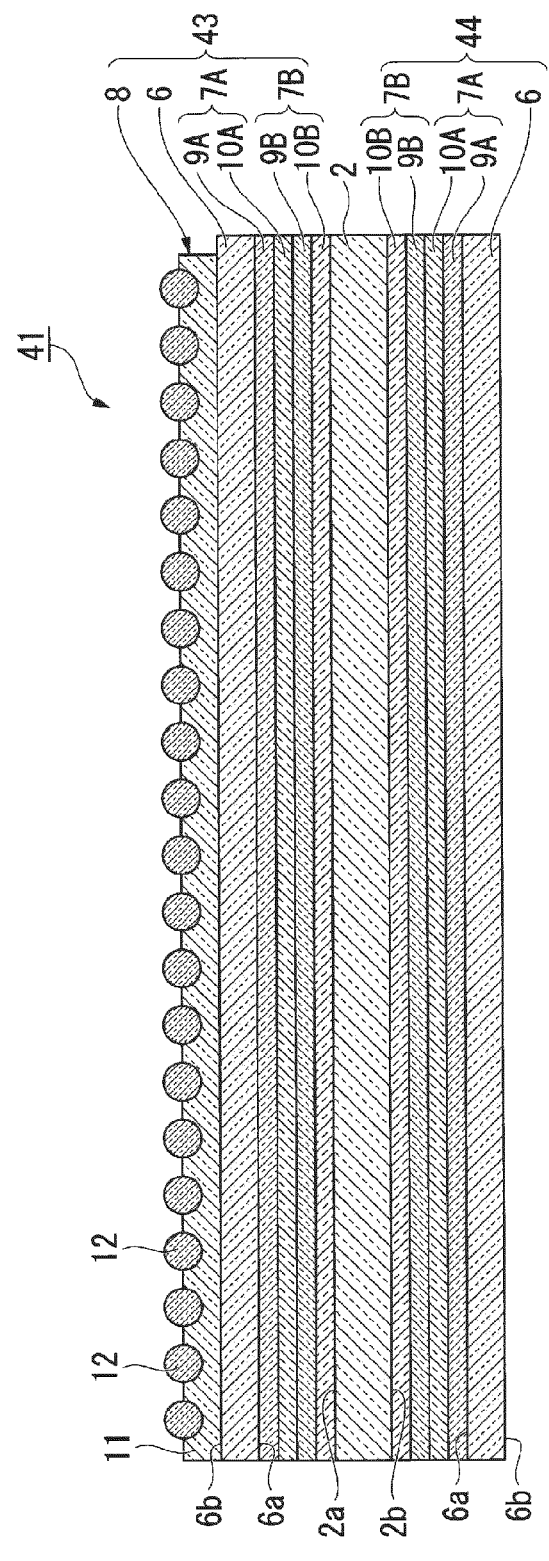
FIG. 4 is a schematic cross-sectional view illustrating a configuration of a wavelength conversion sheet according to a fourth embodiment of the present invention.

Referring to FIG. 4, a wavelength conversion sheet 41 according to a fourth embodiment of the present invention will be described. The wavelength conversion sheet 41 is different from the wavelength conversion sheet 21 of the second embodiment in the configuration of the first and second barrier films. In the wavelength conversion sheet 41 of the present embodiment, components that are the same as those of the first to third embodiments are designated with the same reference signs to omit duplicate description.

As shown in FIG. 4, the wavelength conversion sheet 41 according to the present embodiment includes a phosphor layer (the phosphor) 2, a first barrier film (the barrier film) 43 provided on the surface 2a of the phosphor layer 2, and a second barrier film 44 provided on the surface 2b of the phosphor layer 2. More specifically, the two faces 2a and 2b of the phosphor layer 2 are covered with the first barrier film 43 and the second barrier film 44, respectively, directly, or via the sealing resin layer 5 (not shown in FIG. 4, see FIG. 5). Thus, there is formed a structure in which the phosphor layer 2 is wrapped (i.e., sealed) between the first barrier film 43 and the second barrier film 44.

(First Barrier Film)

The first barrier film 43 includes a base material 6, first and second barrier layers 7A and 7B, and a coating layer 8.

As shown in FIG. 4, in the first barrier film 43, the first barrier layer 7A and the second barrier layer 7B are laminated in this order on the surface 6a of the base material 6 facing the surface 2a of the phosphor layer 2. The first barrier layer 7A is formed of a first inorganic thin film layer 9A and a first gas barrier cover layer 10A which are laminated in this order on the surface 6a of the base material 6. The second barrier layer 7B is formed of a second inorganic thin film layer 9B and a second gas barrier cover layer 10B which are laminated in this order on the first gas barrier cover layer 10A of the first barrier layer 7A. In the present embodiment, the surface 2a of the phosphor layer 2 is in contact with the second gas barrier cover layer 10B.

The coating layer 8 is laminated on the surface 6b of the base material 6.

In other words, the configuration of the first barrier film 43 of the present embodiment is different from that of the first barrier film 23 of the second embodiment in that a laminate of the first and second barrier layers 7A and 7B is provided being in contact with the phosphor layer 2, and the coating layer 8 is provided on the surface 6b opposite to the phosphor layer 2 side.

(Second Barrier Film)

The configuration of the second barrier film 44 is different from that of the first barrier film 43 in that the second barrier film 44 has the base material 6 and the first and second barrier layers 7A and 7B and does not have the coating layer 8.

As shown in FIG. 4, in the second barrier film 44, surface 6a of the base material 6 is disposed so as to face the surface 2b of the phosphor layer 2. Further, the first barrier layer 7A and the second barrier layer 7B are laminated in this order on the surface 6a of the base material 6. The first barrier layer 7A is formed of a first inorganic thin film layer 9A and a first gas barrier cover layer 10A which are laminated in this order on the surface 6a of the base material 6. The second barrier layer 7B is formed of a second inorganic thin film layer 9B and a second gas barrier cover layer 10B which are laminated in this order on the first gas barrier cover layer 10A of the first barrier layer 7A. In the present embodiment, the surface 2b of the phosphor layer 2 is in contact with the second gas barrier cover layer 10B.

In other words, the second barrier film 44 is different from the first barrier film 43 in that in the second barrier film 44, a laminate of the first and second barrier layers 7A and 7B is provided to a surface facing the phosphor layer 2, and the coating layer 8 is not provided on the surface 6b opposite to the phosphor layer 2 side. It should be noted that the configuration of the first barrier film 43 can be applied to the configuration of the base material 6 and the first and second barrier layers 7A and 7B.

As described above, the wavelength conversion sheet 41 of the present embodiment can provide advantageous effects similar to those of the wavelength conversion sheets 1, 21 and 31 of the first to third embodiments.

In the wavelength conversion sheet 41 of the present embodiment, the barrier layer is formed by alternately laminating inorganic thin film layers and gas barrier cover layers so as to be a laminate of two or more layers, and thus much better barrier performance can be exerted.

Fifth Embodiment

Figures 6, 7:
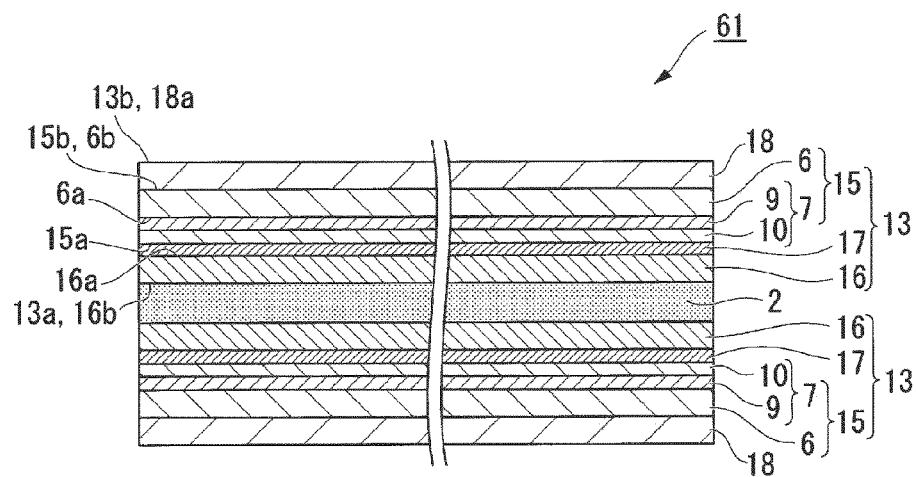
FIG. 6 is a schematic cross-sectional view illustrating the configuration of a wavelength conversion sheet according to a first embodiment, to which the present invention is applied.
FIG. 7 is a schematic cross-sectional view illustrating the configuration of a wavelength conversion sheet according to a second embodiment, to which the present invention is applied.

A wavelength conversion sheet 61 according to a fifth embodiment of the present invention will be described. FIG. 6 is a schematic cross-sectional view illustrating the configuration of the wavelength conversion sheet 61. The wavelength conversion sheet 61 according to the present embodiment includes quantum dot phosphors, and can be used in a backlight unit to serve as LED wavelength conversion phosphors. In the wavelength conversion sheet 61 of the present embodiment, components that are the same as those of the wavelength conversion sheet 1 of the first embodiment are designated with the same reference signs to omit duplicate description.

As shown in FIG. 6, the wavelength conversion sheet 61 according to the present embodiment includes a phosphor layer (also referred to as a wavelength conversion layer) 2 containing quantum dot phosphors and phosphor protective films 13 respectively provided on the surface 2a and the surface 2b of the phosphor layer 2. More specifically, the two surfaces 2a and 2b of the phosphor layer 2 are covered with the respective phosphor protective films 13 directly, or via the sealing resin layer 5 (not shown in FIG. 6, see FIGS. 7 and 8). Thus, there is formed a structure in which the phosphor layer 2 is wrapped (i.e., sealed) between the phosphor protective films 13.

(Phosphor Protective Film)

As shown in FIG. 6, each phosphor protective film 13 includes a barrier film 15 having a first base material 6 and a barrier layer 7, a plastic film (the second base material) 16, an adhesive layer 17, and a coating layer 18. The barrier layer 7 provided on the surface 6a of the first base material 6 is laminated with the plastic film 16 so as to be in a face-to-face relationship via the adhesive layer 17. In other words, the phosphor protective film 13 is a laminated film, in which the barrier film 15 and the plastic film 16 are laminated in such a manner that the barrier layer 7 is sandwiched between the first base material 6 and the second base material (the plastic film) 16.

As shown in FIG. 6, in the wavelength conversion sheet 61, the phosphor protective films 13 are laminated in such a manner that the plastic film 16 is disposed on the phosphor layer 2 (the plastic film 16 is in contact with the phosphor layer 2).

More specifically, in the wavelength conversion sheet 61, the phosphor protective film 13 is disposed in such a manner that a surface 16b of the plastic film 16 on the opposite side of a surface 16a that faces the barrier layer 7 is disposed so as to face (contact) the surface 2a of the phosphor layer 2. The coating layer 18 is laminated on the surface 6b of the first base material 6 configuring the barrier film 15. In other words, the coating layer 18 is provided on the surface of the phosphor protective film 13 to serve as a surface of the wavelength conversion sheet 61.

As shown in FIG. 6, the barrier film 15 includes the first base material 6, and the barrier layer 7 provided on the surface 6a of the first base material 6.

Films that can be used as the first base material 6 include, but are not limited to, a polyethylene terephthalate film, a polyethylene naphthalate film, and the like. The thickness of the first base material 6 is not specifically limited, but is desirably 50 µm or less to reduce the total thickness of the wavelength conversion sheet 61.

The plastic film 16 includes at least the second base material, and may be formed of the second base material alone. Examples of films that can be used as the plastic film (the second base material) 16 include, but are not limited to, a polyethylene terephthalate film and a polyethylene naphthalate film. Specifically, a polyethylene terephthalate film having an acid value of 25 or less is more preferably used. The acid value is a milligram value of potassium hydroxide required to neutralize free fatty acid and other acidic substances contained per 1 gram of fats and oils, such as a fat, an oil or a wax. If the acid value of the base material 6 exceeds 30, the barrier properties can be degraded, which is not preferable, because base material stability is impaired specifically under a high-temperature high-humidity environment. On the other hand, when the acid value is 30 or less, base material stability can be increased, causing no reduction in the barrier properties under a high-temperature high-humidity environment, which is preferable.

The thickness of the plastic film (second base material) 16 is not specifically limited. Desirably, a film with a thickness of 25 µm or less is used to decrease the total thickness of the phosphor protective film 13 or the wavelength conversion sheet 61.

As shown in FIG. 6, the plastic film 16 is provided so as to face the first base material 6 via the barrier layer 7 provided on the surface 6a of the first base material 6, and the adhesive layer 17. In other words, the barrier film 15 and the plastic film 16 are laminated in such a manner that the barrier layer 7 is sandwiched between the first base material 6 and the second base material (plastic film) 16. In this way, since the barrier layer 7 is sandwiched between the first base material 6 and the second base material (plastic film) 16, if any defect, such as micro pin holes, is caused on the barrier layer 7, the barrier performance can be more effectively exerted.

As shown in FIG. 6, the adhesive layer 17 is provided between the barrier film 15 and the plastic film 16 to bond therebetween. Materials that can be used for the adhesive layer 17 include, but are not limited to, an adhesive or a tackifier such as of an acrylic material, urethane-based material, polyester-based material, and the like. More specifically, any one of an acrylic resin tackifier, a urethane-based adhesive, and an ester-based adhesive can be used.

The thickness of the adhesive layer 17 is not specifically limited, but is desirably 20 µm or less in order to reduce the total thickness of the phosphor protective film 13 or the total thickness of the wavelength conversion sheet 61.

In order to exert one or more optical functions, the coating layer 18 is provided on the surfaces of the respective phosphor protective films 13, i.e., the surfaces of the wavelength conversion sheet 61. The optical functions include, but are not limited to, interference fringe (Moire) prevention, anti-reflection, diffusion, and the like. In the backlight unit (the wavelength conversion sheet 61) of the present embodiment, the coating layer has at least an interference fringe prevention function.

The coating layer 18 may be configured to include a binder resin layer and fine particles as in the first embodiment. Micro irregularities may be produced on the surface of the coating layer 18 by burying fine particles so as to be partially exposed from the surface of the binder resin layer. By providing the coating layer 18 on the surfaces of the respective phosphor protective films 13, i.e., the surfaces of the wavelength conversion sheet 61, the occurrence of Newton's rings is lowered or even prevented.

The binder resin layer is not specifically limited, but a resin having high optical transparency may be used. More specifically, examples of materials that can be used include a thermoplastic resin, a thermosetting resin and an ionizing radiation hardening resin, such as a polyester resin, acrylic resin, acrylic urethane resin, polyester acrylate resin, polyurethane acrylate resin, urethane resin, epoxy resin, polycarbonate resin, polyamide resin, polyimide resin, melamine resin, phenol-based, and the like. Among them, an acrylic resin having high light resistance and good optical properties is desirably used.

Examples of the fine particles that can be used include, but are not limited to, inorganic fine particles, such as silica, clay, talc, carbonic acid calcium, sulfuric acid calcium, barium sulfate, titanium oxide, alumina, and the like, as well as organic fine particles, such as a styrene resin, urethane resin, silicone resin, acrylic resin, and the like. These materials can be used singly or in combination of two or more.

The phosphor protective film 13 thus configured is a laminate film in which the barrier film 15 and the plastic film 16 are laminated in such a manner that the barrier layer 7 is sandwiched between the first base material 6 and the second base material 16. Thus, adverse effects of splashes can be lowered or even prevented, and accordingly the phosphor protective film 13 has good barrier properties. Moreover, when the phosphor protective film 13 is used as a component of the wavelength conversion sheet 61, the performance of the phosphor layer 2 using quantum dots can be increased or even maximally exerted, and the occurrence of interference fringes, such as Newton's rings, can be lowered or even prevented. As a result, a display of high efficiency, high definition, and a long life can be obtained.

Next, a method of fabricating the wavelength conversion sheet 61 of the present embodiment will be described.

In the method of fabricating the wavelength conversion sheet 1 of the present embodiment, for example, the phosphor layer 2 can be laminated between the pair of phosphor protective films 13 through the procedure set forth below.

(Fabrication Process of Phosphor Protective Film 13)

When fabricating the phosphor protective film 13, first, the coating layer 18 is formed on at least one surface of the first base material 6. Specifically, first, a coating liquid is prepared by mixing an acrylic resin to be a binder with acrylic fine particles, and the coating liquid is applied onto at least one surface of the first base material 6, thereby obtaining the base material 6 on which the coating layer 18 is provided. Then, the inorganic thin film layer 9 is laminated by vapor deposition, for example, on the surface 6b of the first base material 6 on the opposite side of the surface 6a on which the coating layer 18 is provided. Then, a coating agent is applied onto a surface of the inorganic thin film layer 9 to form the gas barrier cover layer 10. The coating agent is obtained by preparing an aqueous solution or water/alcohol mixture solution containing as base resin a water-soluble polymer (hydroxyl group-containing polymer compound) and at least either (a) one or more metal alkoxides and hydrolysates or (b) tin chloride. Thus, the barrier film 15, with the coating layer 18 and the barrier layer 7 being provided on the first base material 6, is obtained.

Then, the barrier film 15 and the plastic film 16 are bonded to each other for lamination using the adhesive layer 17. Specifically, the barrier film 15 is adhered to the plastic film 16 such that the barrier layer 7 is sandwiched between the first base material 6 of the barrier film 15 and the plastic film 16. As the adhesive layer 17, any one of an acrylic resin tackifier, a urethane adhesive, and an ester adhesive is used. Thus, there is obtained the phosphor protective film 13 in which the first base material 6 and the plastic film 16 are laminated, with the barrier layer 7 being interposed therebetween.

(Fabrication Process of Phosphor Layer 2 and Lamination Process of Phosphor Protective Film)

The method of forming the phosphor layer 2 is not specifically limited. For example, the method includes, as described in JP-A-2013-544018, dispersing a phosphor material in a binder resin, such as a photosensitive resin or a thermosetting resin, coating the prepared mixed solution onto a plastic film 16 side surface 13a (16b) of the phosphor protective film 13, on which the coating layer 18 is not provided, followed by UV curing or thermosetting, for sealing. The wavelength conversion sheet 61 can be fabricated in this way. As the photosensitive resin and the thermosetting resin, an acrylic resin, an epoxy resin, and a polyolefin resin can be mentioned.

In the present embodiment, the fabrication process of the phosphor layer 2 and the lamination process of the phosphor protective film are not specifically limited to the above methods. For example, a phosphor layer 2 may be formed on the plastic film 16 side surface 13a (16b) of one phosphor protective film 13, on which the coating layer 18 is not provided, followed by laminating another phosphor protective film 13 on the phosphor layer 2.

As described above, the phosphor protective film 13 according to the present embodiment is a laminated film in which the barrier film 15 and the plastic film 16 are laminated so as to sandwich the barrier layer 7 between the first base material 6 and the second base material (the plastic film) 16. Thus, the adverse effects of splashes can be minimized, and, by sandwiching the barrier layer between PET films having good thermal stability, good barrier properties can be exerted. Moreover, since the coating layer 18 is provided on surface of the phosphor protective film 13, the occurrence of interference fringes can be lowered or even prevented, and fluctuations in light from the light source can be lowered or even prevented.

In the wavelength conversion sheet 61 of the present embodiment, the phosphor layer 2 that contains quantum dot phosphors is laminated to the phosphor protective films 13 and sealed to impart good barrier properties. Accordingly, the performance of quantum dots can be increased or even maximally exerted.

A backlight unit, when equipped with the wavelength conversion sheet 61 of the present embodiment, can provide a display with no defects and or unevenness and exhibiting rich colors closer to natural colors with a good hue.

In the wavelength conversion sheet 61 of the present embodiment, the phosphor protective films 13 laminated on the phosphor layer 2 each include the coating layer 18 having an optical function. The coating layer 18 is provided so as to serve as a surface of the wavelength conversion sheet 61. Accordingly, the occurrence of interference fringes, such as Newton's rings, can be reduced, and fluctuations in light from the light source can be reduced.

The wavelength conversion sheet 61 of the present embodiment uses the phosphor protective films 13 having good barrier properties and high transparency. Accordingly, a backlight unit for display increasing or even maximally exerting the performance of quantum dots can be provided.

Moreover, the wavelength conversion sheet 61 of the present embodiment, which uses the phosphor protective films 13 having good barrier properties and high transparency, can provide a display that exhibits rich colors closer to natural colors with a good hue.

Sixth Embodiment

Referring to FIG. 7, a wavelength conversion sheet 71 according to a sixth embodiment of the present invention will be described. The present embodiment is different from the wavelength conversion sheet 61 of the fifth embodiment only in the configuration of the phosphor protective film. Therefore, in the wavelength conversion sheet of the present embodiment, components that are the same as those of the fifth embodiment are designated with the same reference signs to omit duplicate description.

As shown in FIG. 7, the wavelength conversion sheet 71 according to the present embodiment includes a phosphor layer (the wavelength conversion layer) 2 that contains quantum dot phosphors, and phosphor protective film 73 provided on the surface 2a and the surface 2b, respectively, of the phosphor layer 2. More specifically, the phosphor protective films 73 are laminated on the respective two surfaces 2a and 2b of the phosphor layer 2 directly, or via the sealing resin layer 5 (not shown in FIG. 7, see FIGS. 8 and 9). Thus, there is formed a structure is in which the phosphor layer 2 is wrapped (sealed) between the phosphor protective films 73.

(Phosphor Protective Film)

The phosphor protective film 73 of the present embodiment has a barrier film 15 having the first base material 6 and the barrier layer 7, the plastic film (the second base material) 16, the adhesive layer 17, and the coating layer 18. The barrier layer 7 provided on the surface 6a of the first base material 6 is laminated with the plastic film 16 so as to be in a face-to-face relationship via the adhesive layer 17. In other words, the phosphor protective film 73 is a laminated film, in which the barrier film 15 and the plastic film 16 are laminated in such a manner that the barrier layer 7 is sandwiched between the first base material 6 and the second base material (the plastic film) 16.

As shown in FIG. 7, in the phosphor protective films 73, the barrier film 15 is laminated such that a first base material 6 side surface 15b (6b) of the barrier film 15 is in contact with the phosphor layer 2.

More specifically, in the wavelength conversion sheet 71, the phosphor protective film 73 is disposed such that the surface 6b of the first base material 6 of the barrier film 15 opposite to the surface 6a, on which the barrier layer 7 is provided, faces the surface 2a of the phosphor layer 2. Further, the coating layer 18 is laminated on a surface 16b of the plastic film 16 opposite to a surface 16a that faces the barrier layer 7. In other words, in the present embodiment as well, the coating layer 18 is provided on the surfaces of the respective phosphor protective films 73 to serve as the surfaces of the wavelength conversion sheet 71.

As described above, the wavelength conversion sheet 71 of the present embodiment can provide the advantageous effects similar to those of the wavelength conversion sheet 61 of the fifth embodiment.

The technical scope of the present invention is not limited to the foregoing embodiments, but can be variously modified within a scope not departing from the spirit of the present invention. The configurations of the first barrier films 3, 23, 33, and 43 of the wavelength conversion sheets 1, 21, 31, and 41, respectively, of the first to the fourth embodiments are only examples and the present invention should not be limited to these examples. Specifically, the first barrier film configuring the wavelength conversion sheet of the present invention only has to be provided with one or more base materials 6, one or more barrier layers 7, and the coating layer 8, and the coating layer 8 only has to be provided on the surface of the barrier film.

The coating layer according to the present invention is not limited to the configuration of the coating layer 8 of the first barrier film 3, 23, 33 or 43, i.e., a single-layer structure that exerts interference fringe (Moire) prevention function, but may be a laminate of layers exerting a plurality of functions.

Of the first and second barrier films covering the phosphor layer 2 in the wavelength conversion sheet of the present invention, at least one barrier film may include the coating layer 8, or both of the first and the second barrier films may include the coating layer 8.

Figure 5:
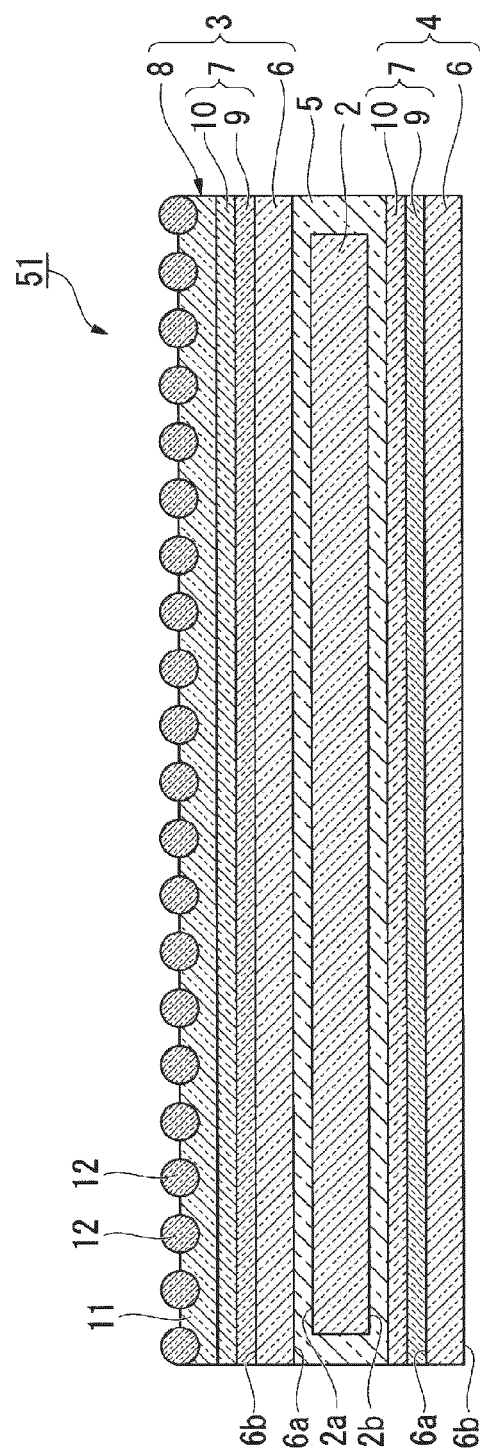
FIG. 5 is a schematic cross-sectional view illustrating another configuration of a wavelength conversion sheet according to an embodiment of the present invention.

The wavelength conversion sheets 1, 21, 31, and 41 of the first to fourth embodiments, respectively, described above each have a configuration in which the phosphor layer 2 is directly sealed between the first and second barrier films. However, the configuration is not limited to this configuration. For example, as shown in FIG. 5, it may be so configured that a sealing resin layer 5 is provided separately from the phosphor layer 2 to cover and seal the phosphor layer 2. With this configuration of providing the sealing resin layer 5 between the first and second barrier films 3 and 4 to seal the phosphor layer 2, a wavelength conversion sheet 51 having much better barrier properties can be provided.

Examples of the materials that can be used for the sealing resin layer 5 include a thermoplastic resin, a thermosetting resin, and an ultraviolet curable resin. More specifically, the usable materials include an epoxy resin, a silicone resin, an ethylene-vinyl acetate copolymer resin, and the like.

The configurations of the wavelength conversion sheets 61 and 71 and those of the phosphor protective films 13 and 73 of the fifth and sixth embodiments, respectively, are only examples, and are not limited to these.

Figure 8:
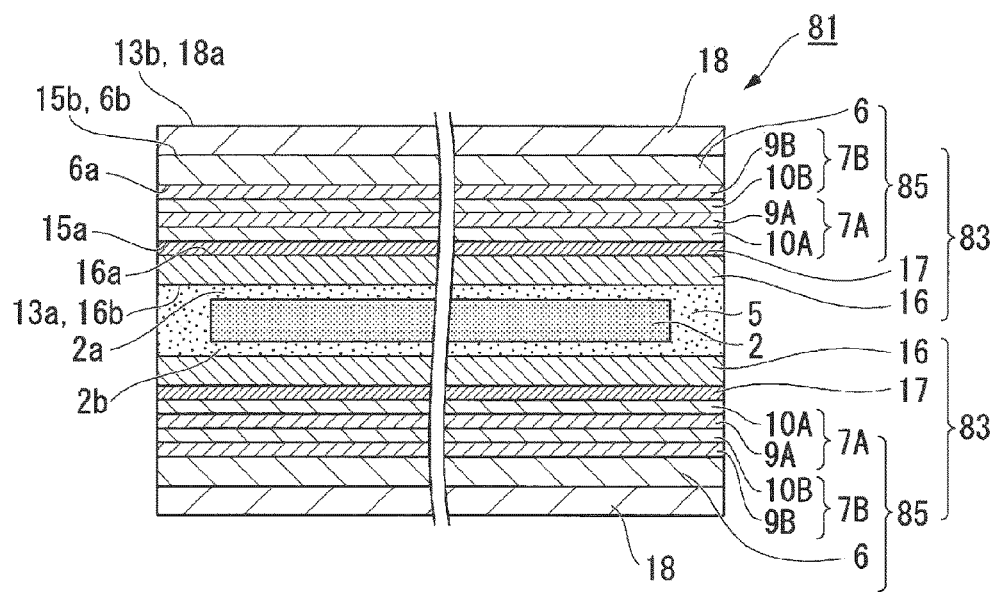
FIG. 8 is a schematic cross-sectional view illustrating another configuration of a phosphor protective film according to the present invention.

Specifically, the phosphor protective films 13 and 73 of the fifth and sixth embodiments described above are each configured such that a single barrier layer 7 is provided between the first base material 6 and the plastic film 16. However, the configuration is not limited to these. For example, as shown in FIG. 8, a phosphor protective film 83 may be configured by laminating the first barrier layer 7A formed of the first inorganic thin film layer 9A and the first gas barrier cover layer 10A, with the second barrier layer 7B formed of the second inorganic thin film layer 9B and the second gas barrier cover layer 10B. In this way, with the phosphor protective film 83 formed by alternately laminating inorganic thin film layers and gas barrier cover layers so as to be a laminate of two or more layers, much better barrier performance can be exerted. Further, the phosphor protective film of the present invention may be provided with two or more barrier layers 7.

As in the fifth and the sixth embodiments, in the wavelength conversion sheet according to the present invention, the sealing resin layer 5 including the phosphor layer 2 may be sandwiched between the same phosphor protective films 13 (or 73), or may be sandwiched between the phosphor protective films 13 and 73 of different configurations.

The wavelength conversion sheet according to the present invention may have a configuration in which at least one of the phosphor protective films covering the phosphor layer 2 has the coating layer 18, or both of the phosphor protective films have the respective coating layers 18.

Figure 9:
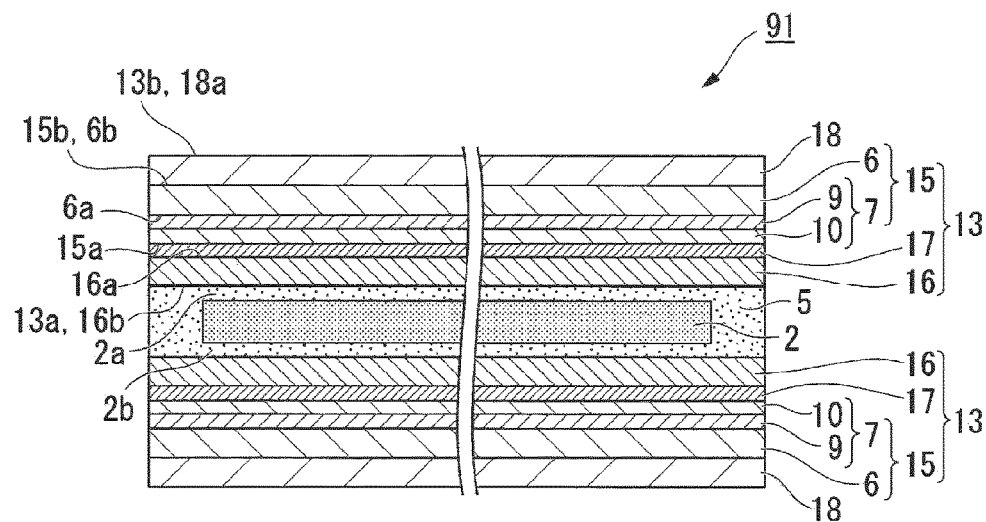
FIG. 9 is a schematic cross-sectional view illustrating another configuration of a wavelength conversion sheet according to the present invention.

In the wavelength conversion sheets 61 and 71 of the fifth and sixth embodiments, respectively, described above, the phosphor layer 2 is configured to be directly sealed with the phosphor protective films 13 (73). However, the configuration is not limited to these. For example, as shown in FIG. 9, it may be so configured that a sealing resin layer 5 is provided separately from the phosphor layer 2 to cover and seal the phosphor layer 2. With this configuration of providing the sealing resin layer 5 between the phosphor protective films 13 to seal the phosphor layer 2, a wavelength conversion sheet 91 having much better barrier properties can be provided.

<Backlight Unit>

Figure 10:
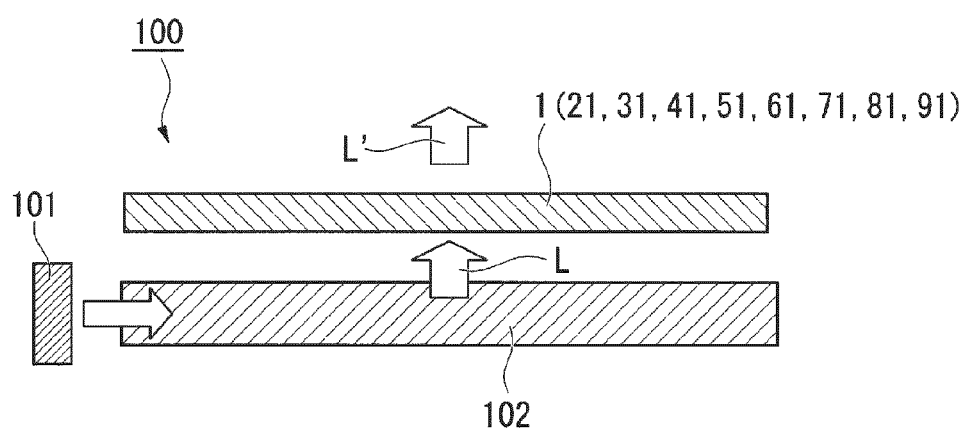
FIG. 10 is a diagram illustrating an example of a backlight unit on which a wavelength conversion sheet according to an embodiment is mounted.

Using the wavelength conversion sheet of the foregoing embodiments, a backlight unit applied such as to a liquid crystal display can be provided. FIG. 10 shows an example of a backlight unit 100 equipped with the wavelength conversion sheet 1 (21, 31, 41, 51, 61, 71, 81 or 91) of the foregoing embodiments.

The backlight unit 100 includes a light emitting diode (LED) light source 101, a light guide plate 102, and the wavelength conversion sheet 1. The LED light source is disposed on a side surface of the light guide plate, and, although not shown, a reflector, a diffuser, a prism sheet, and the like may be further provided.

The LED light source 101 is disposed at an end of the side surface of the light guide plate 102, while the wavelength conversion sheet 1 is disposed on the light guide plate 102 (in the traveling direction of light). Inside the LED light source 101, a plurality of LED elements emitting blue light are provided. The LED elements may be violet LEDs, or may be LEDs at a wavelength lower than that of the violet LEDs. The LED light source 101 emits light ward the side surface of the light guide plate 102. When a backlight unit uses a wavelength conversion sheet of the foregoing embodiments, light L discharged from the light guide plate 102 enters into the phosphor layer in the wavelength conversion sheet, and becomes light L' whose wavelength has been converted.

The light guide plate 102 serves to efficiently guide light emitted from the LED light source 101, and a known material is used for it. Examples of films that can be used for the light guide plate 102 include an acrylic film, a polycarbonate film, a cycloolefin film, and the like. The light guide plate 102 can be formed, for example, by a silk printing method, a forming method such as injection, extrusion or the like, or an ink jet printing method. The thickness of the light guide plate 102 is in the range of 100 to 1000 μm, for example. The light guide plate 102 may be provided with a reflector or a fine pattern for reflecting light emitted from the LED light source 101 toward the wavelength conversion sheet.

Advantageous effects of the invention will be further described by way of Examples and Comparative Examples. However, the present invention should not be limited to the following examples.

FIRST EXAMPLE

Example 1

A wavelength conversion sheet with the configuration shown in FIG. 1 was prepared.

Silicon oxide with a thickness of 250 Å was formed, as an inorganic thin film layer, on one surface of a polyethylene terephthalate film (acid value of 28) by vacuum vapor deposition. Further, coating liquids respectively containing alkoxysilane and polyvinyl alcohol were prepared, and the coating liquids were sequentially applied and laminated, as gas a barrier cover layer, onto the silicon oxide by wet coating, thereby obtaining a gas barrier cover layer with a thickness of 0.3 μm. Thus, a second barrier film was obtained.

Then, coating films respectively containing an acrylic resin and silica particles (average particle size of 1.0 μm) were applied onto a surface of a gas barrier cover layer of a laminate, which was prepared by a process similar to that of the second barrier film, followed by curing the acrylic resin, thereby obtaining a first barrier film having a coating layer with a thickness of 5 μm.

CdSe/ZnS 530 (manufactured by Sigma-Aldrich Co. LLC.), after its concentration was adjusted, was dispersed in a solvent to prepare a phosphor solution. The phosphor solution was mixed with an epoxy photosensitive resin, and the mixture was coated onto the gas barrier cover layer of the previously prepared second barrier film, thereby obtaining a phosphor layer with a thickness of 100 μm.

The previously prepared first barrier film was disposed on the upper surface of the obtained phosphor layer, such that the surface of the first barrier film opposite to the surface laminated with the gas barrier cover layer faced the phosphor layer, followed by curing the phosphor layer by UV irradiation, thereby obtaining a wavelength conversion sheet of Example 1.

For measurement of acid value, a cut film was weighed and thermally melted in cresol, followed by cooling. After that, the resultant object was titrated with a potassium hydroxide ethanol solution to quantify the acid value. A phenolphthalein solution was used (see JIS K0070) as the indicator.

Example 2

A wavelength conversion sheet of Example 2 was obtained with an operation similar to Example 1, except that a polyethylene terephthalate film (acid value of 17) was used.

Example 3

A wavelength conversion sheet with the configuration shown in FIG. 2 was prepared through the following process. Unless otherwise mentioned, the configuration and the procedure are similar to those of Example 1.

Silicon oxide with a thickness of 250 Å was formed, as an inorganic thin film layer, on one surface of a polyethylene terephthalate film (acid value of 17) by vacuum vapor deposition. Further, coating liquids respectively containing alkoxysilane and polyvinyl alcohol were prepared, and the coating liquids were sequentially applied and laminated, as gas a barrier cover layer, onto the silicon oxide by wet coating, thereby obtaining a gas barrier cover layer with a thickness of 0.3 μm. Thus, a second barrier film was obtained.

Then, coating films respectively containing an acrylic resin and silica particles (average particle size of 1.0 μm) were applied onto a surface of a laminate opposite to the surface where a gas barrier cover layer was formed, the laminate being prepared by a process similar to that of the second barrier film, followed by curing the acrylic resin to form a coating layer with a thickness of 5 μm on one surface, thereby obtaining a first barrier film.

A phosphor coating liquid was applied onto the gas barrier cover layer of the second barrier film through a process similar Example 1 to obtain a phosphor layer with a thickness of 100 μm.

The previously prepared first barrier film was laminated on the upper surface of the obtained phosphor layer, such that the gas barrier cover layer of the first barrier film faced the phosphor layer followed by curing the phosphor layer by UV irradiation, thereby obtaining a wavelength conversion sheet of Example 3.

Example 4

Instead of directly forming a coating layer on the first barrier film as done in Example 1, coating films respectively formed of an acrylic resin and silica particles (average particle size of 1.0 μm) were applied to another polyethylene terephthalate film, followed by curing the acrylic resin, thereby forming a coating layer with a thickness of 5 μm. The polyethylene terephthalate film including the coating layer was disposed such that a surface thereof opposite to the coating layer-formed surface thereof faced the surface of the first barrier film where the gas barrier cover layer was formed, followed by bonding these surfaces by use of an acrylic tackifiers, thereby preparing a first barrier film of Example 4. Configuration and procedure similar to those of Example 1 were applied to the rest of the process, thereby preparing a wavelength conversion sheet having a configuration shown in FIG. 3.

Example 5

In the preparation process of the first barrier film and the second barrier film, a gas barrier coating layer was formed on a polyethylene terephthalate film, followed by providing thereon silicon oxide with a thickness of 250 Å, as a second inorganic thin film layer, by vacuum vapor deposition. Coating liquids respectively containing alkoxysilane and polyvinyl alcohol were prepared and sequentially applied and laminated, as a second gas barrier coating layer, to the second inorganic thin film layer by wet coating, thereby forming a gas barrier cover layer with a thickness of 0.3 μm. Configuration and procedure similar to those of Example 3 were applied to the rest of the process, thereby preparing a wavelength conversion sheet having a configuration shown in FIG. 4.

Comparative Example 1

A wavelength conversion sheet according to Comparative Example 1 was obtained similarly to Example 1, except that no coating layer was provided on the first barrier film in example 1.

<Evaluation of Barrier Films>

To evaluate barrier properties of the barrier films, moisture permeability (g/m$^2$·day) was measured in an atmosphere of 40° C.90% RH using a moisture permeability measuring device (Permatoran 3/31 manufactured by Modern Control Co.). The results are shown in Table 1.

<Evaluation of Wavelength Conversion Sheets>

The wavelength conversion sheets were measured of the initial luminance and the luminance after 60° C.90% RH×1,000-hour storage using a luminance meter (LS-100 manufactured by Konica Minolta, Inc.). The results are shown in Table 1. The difference in luminance over time becomes smaller when barrier properties are better. The overall evaluation is also provided below.

<Appearance>

The fluctuations in light caused by the adverse effects, such as of the quantum dot pattern or the film wrinkles, were visually confirmed. The results are shown in Table 1. In the table, "Very good" indicates that no wrinkles or the like were observed and uniform in-plane light emission required for the performance of the backlight unit was performed very well. "Good" indicates that wrinkles or the like were slightly observed but uniform light emission was performed well, i.e., there was no difference in in-plane luminance distribution. "Poor" indicates not only that wrinkles or the like were visually confirmed, but also that the in-plane luminance distribution was varied.

TABLE 1

| | Moisture permeability (g/m²/day) | Luminance (cd/m²) | | Appearance |
| --- | --- | --- | --- | --- |
| | | Initial | After 60° C. 90% RH × 1,000 hours | |
| Example 1 | $2 \times 10^{-2}$ | 90 | 87 | Good |
| Example 2 | $9 \times 10^{-3}$ | 91 | 88 | Good |
| Example 3 | $9 \times 10^{-3}$ | 90 | 88 | Good |
| Example 4 | $3 \times 10^{-2}$ | 87 | 86 | Very good |
| Example 5 | $2 \times 10^{-3}$ | 86 | 86 | Good |
| Comparative Example 1 | $2 \times 10^{-2}$ | 90 | 85 | Poor |

As shown in Table 1, the wavelength conversion sheets using the first barrier films of Examples 1 to 5 were able to maintain high luminance in a severe environment, which is characteristic of a quantum dot display. The wavelength conversion sheets using the first barrier films of Examples 1 to 5 obtained uniform light with no fluctuations, and showed good appearance.

Comparative Example 1 was able to maintain high luminance in a severe environment. However, the uniformity of the light source was poor, and fluctuations were observed, due to the absence of coating layers from the first and second barrier films.

SECOND EXAMPLE

Example 6

A wavelength conversion sheet having the configuration illustrated in FIG. 6 was prepared.

(Preparation of Phosphor Protective Film)

Silicon oxide with a thickness of 250 Å was formed, as an inorganic thin film layer, on one surface of a polyethylene terephthalate film (acid value of 17), by vacuum vapor deposition. Coating liquids respectively containing alkoxysilane and polyvinyl alcohol were prepared and sequentially laminated, as a gas barrier cover layer, on the silicon oxide by wet coating, thereby forming a gas barrier cover layer with a thickness of 0.3 μm. Thus, a barrier film was obtained.

Then, the polyethylene terephthalate film was bonded to the gas barrier cover layer of the barrier film using an acrylic resin adhesive, thereby obtaining a laminate film including a barrier film.

A coating liquid containing an acrylic resin and fine particles (average particle size of 3 μm) of an acrylic resin was prepared and laminated to the opposite side of the gas barrier cover layer of the barrier film, by wet coating, thereby forming a coating layer with a thickness of 5 μm. Thus, a phosphor protective film of Example 6 was obtained.

(Preparation of Wavelength Conversion Sheet)

CdSe/ZnS 530 (manufactured by Sigma-Aldrich Co. LLC.), after its concentration being adjusted, was dispersed in a solvent to prepare a phosphor solution. The phosphor solution was mixed with a photosensitive resin, and the mixture was coated onto the polyethylene terephthalate film of the previously prepared phosphor protective film, thereby obtaining a phosphor layer with a thickness of 100 μm.

On the phosphor layer coated onto a phosphor protective film, another phosphor protective film of the same configuration was laminated, such that the acrylic resin coating layer was on the outer side, followed by UV curing, thereby obtaining a wavelength conversion sheet of Example 6 (see FIG. 6).

(Preparation of Backlight Unit)

An LED light source and a light guide plate were mounted to the obtained wavelength conversion sheet to prepare a backlight unit of Example 6.

Example 7

A phosphor protective film of Example 7 was obtained as done in Example 6, except that an acrylic resin coating layer with a thickness of 1 μm was provided to the polyethylene terephthalate film of the laminate film of Example 6. A wavelength conversion sheet and a backlight unit were prepared similarly to Example 6 using two phosphor protective films that were prepared such that the acrylic resin coating layer of each of the phosphor protective films was on the outer side.

Comparative Example 2

A phosphor protective film of Comparative Example 2 was obtained as done in Example 6, except that a polyethylene terephthalate film was bonded to the opposite side of the gas barrier cover layer of the barrier film, using an acrylic resin adhesive, and a coating layer containing an acrylic resin and fine particles was provided on the gas barrier cover layer. A wavelength conversion sheet and a backlight unit were prepared similarly to Example 6, using two phosphor protective films that were prepared such that the acrylic resin coating layer of each of the phosphor protective films was on outer side.

Comparative Example 3

A phosphor protective film of Comparative Example 3 was obtained as done in Example 6, except that no polyethylene terephthalate film was bonded to the barrier film. A wavelength conversion sheet and a backlight unit were prepared similarly to Example 6, using two phosphor protective films that were prepared such that the acrylic resin coating layer of each of the phosphor protective films was on the outer side.

<Measurement of Luminance>

The luminance of the backlight units was measured using a luminance meter (LS-100 manufactured by Konica Minolta, Inc.). The results are shown in Table 2.

<Evaluation of Appearance>

The light emission state of the backlight unit was confirmed and visually evaluated. The evaluation was performed from the viewpoints of diffusibility (whether uniform in-plane light was achieved), foreign substances (whether splashes, flaws, wrinkles and the like were observed), and interference (whether occurrence of interference fluctuations was observed when disposing the polyethylene terephthalate film on the backlight unit). The results are shown in Table 2. Example 7 showed no uniform light emission, splashes or flaws in the plane, interference fluctuations, and the like, thereby satisfying requirements for the performance of the backlight unit. In Comparative Example 2, although the performance required for the backlight unit was good, luminance was poor. In Comparative Example 3, uniform light emission was not observed, or splashes or flaws, and interference fluctuations, and the like were observed, and luminance was also poor.

TABLE 2

| | Appearance evaluation | | | |
|---|---|---|---|---|
| | Luminance (cd/m$^2$) | Diffusibility | Foreign substances | Interference |
| Example 6 | 90 | Good | Good | Good |
| Example 7 | 91 | Good | Good | Good |
| Comparative Example 2 | 85 | Good | Good | Good |
| Comparative Example 3 | 80 | Good | Poor | Good |

As can be seen from Table 2, the backlight units using the wavelength conversion sheets of Examples 6 and 7 were able to reduce the influence of foreign substances, such as splashes, and a uniform light source without fluctuations was obtained, owing to the lamination of the barrier film and the plastic film.

In the backlight unit of Comparative Example 2 using the phosphor protective film in which the inorganic oxide thin film layer and the gas barrier cover layer were provided to the base material so as to be on the same side as the coating layer, luminance was degraded due to slightly poor barrier properties which were due to the distance being large between the phosphor layer to be protected and the barrier layer.

The backlight unit of Comparative Example 3 using the phosphor protective film in which the base material was not bonded or laminated with any film was easily affected by splashes in particular, and thus the performance of the phosphor was locally deteriorated (lowering of luminance).

INDUSTRIAL APPLICABILITY

Using the wavelength conversion sheet of the present invention, an improved or even superior high definition display having reliability can be fabricated.

Using the phosphor protective film, the wavelength conversion sheet and the backlight unit of the present invention, a superior high definition display can be fabricated, the phosphor protective film including a laminate film in which a barrier film and a plastic film are laminated sandwiching a barrier layer therebetween, the wavelength conversion sheet including a phosphor layer covered with the phosphor protective film, and the backlight unit using the wavelength conversion sheet.

REFERENCE SIGNS LIST 1, 21, 31, 41, 51, 61, 71, 81, 91 . . . Wavelength conversion sheet
2 . . . Phosphor layer (phosphor)
3, 23, 33, 34 . . . First barrier film (barrier film)
4, 44 . . . Second barrier film
5 . . . Seal resin
6, 6A, 6B . . . Base material
7, 7A, 7B . . . Barrier layer
8, 18 . . . Coating layer
9, 9A, 9B . . . Inorganic thin film layer
10, 10A, 10B . . . Gas barrier cover layer
11 . . . Binder resin layer
12 . . . Fine particles
13, 73, 83 . . . Phosphor protective film
15, 85 . . . Barrier film
16 . . . Plastic film (second base material)
17 . . . Adhesive layer
100 . . . Backlight unit
101 . . . LED light source
102 . . . Light guide plate

What is claimed is:

1. A wavelength conversion sheet comprising:
a phosphor,
one or more barrier films that seal the phosphor, the one or more barrier films each including a first base material, and
one or more plastic films each including a second base material, the one or more plastic films and the one or more barrier films being laminated together so as to provide a barrier layer between the first base material and the second base material,
wherein at least one of the barrier films includes a coating layer having an optical function, the coating layer being structured to reduce at least interference fringes and being provided on the second base material,
wherein the coating layer includes the binder resin layer and fine particles,
wherein the coating layer has micro-irregularities on a surface thereof,
wherein the one or more barrier films comprises the coating layer, the second base material, an adhesive layer, the barrier layer, and the first base material,
wherein the coating layer is provided above a surface of the second base material on a side opposite to the first base material, and
wherein the barrier film is disposed above the phosphor.

2. The wavelength conversion sheet of claim 1, wherein the binder resin layer has a thickness between 0.1 to 20 μm.

3. The wavelength conversion sheet of claim 2, wherein the fine particles are at least either organic particles or inorganic particles.

4. The wavelength conversion sheet of claim 2, wherein the fine particles have an average particle size in a range of 0.5 to 30 μm.

5. The wavelength conversion sheet of claim 4, wherein:
the fine particles of the coating layer are partially exposed from the surface of the binder resin layer.

6. The wavelength conversion sheet of claim 1, wherein at least one of the barrier films includes one or more barrier layers.

7. The wavelength conversion sheet of claim 6, wherein the barrier layer includes an inorganic thin film layer laminated on one surface of the first base material, and a gas barrier cover layer laminated on the inorganic thin film layer.

8. The wavelength conversion sheet of claim 6, wherein the barrier layer includes a first inorganic thin film layer laminated on one surface of the first base material, a first gas barrier cover layer laminated on the first inorganic thin film layer, a second inorganic thin film layer laminated on the first gas barrier cover layer, and a second gas barrier cover layer laminated on the second inorganic thin film layer.

9. The wavelength conversion sheet of claim 6, wherein the first base material is a polyethylene terephthalate film having an acid value of 25 or less.

10. The wavelength conversion sheet of claim 1, wherein the barrier film including the coating layer has a total light transmittance of 85% or more.

11. A backlight unit comprising:
a light emitting device formed of a blue LED; and
the wavelength conversion sheet of claim 1 disposed on the light emitting device.

12. A phosphor protective film that protects quantum dot phosphors comprising:

one or more barrier films each including a first base material, and one or more barrier layers provided on at least one surface of the first base material; and one or more plastic films each including a second base material, wherein:

the barrier film and the plastic film are laminated so that the barrier layer is sandwiched between the first base material and the second base material, at least one of the barrier film and the plastic film has a coating layer that improves optical properties, and is structured to reduce at least interference fringes; and the coating layer is provided on a surface of the second base material, wherein the coating layer includes the binder resin layer and fine particles, wherein the coating layer has micro-irregularities on a surface thereof, wherein the coating layer includes the binder resin layer and fine particles, wherein the coating layer has micro-irregularities on a surface thereof, wherein the one or more barrier films comprises the coating layer, the second base material, an adhesive layer, the barrier layer, and the first base material, wherein the coating layer is provided above a surface of the second base material on a side opposite to the first base material, and wherein the barrier film is disposed above the quantum dot phosphors.

13. The phosphor protective film of claim 12, wherein the barrier layer includes an inorganic thin film layer laminated on one surface of the first base material, and a gas barrier cover layer laminated on the inorganic thin film layer.

14. The phosphor protective film of claim 12, wherein the barrier layer includes a first inorganic thin film layer laminated on one surface of the first base material, a first gas barrier cover layer laminated on the first inorganic thin film layer, a second inorganic thin film layer laminated on the first gas barrier cover layer, and a second gas barrier cover layer laminated on the second inorganic thin film layer.

15. The phosphor protective film of claim 12, wherein the barrier film and the plastic film are bonded and laminated to each other by the adhesive layer, the adhesive layer comprising any of an acrylic resin tackifier, a urethane adhesive, and an ester adhesive.

16. The phosphor protective film of claim 12, wherein the first base material is a polyethylene terephthalate film having an acid value of 25 or less.

17. The phosphor protective film of claim 12, wherein the gas barrier cover layer contains at least one or more members of a hydroxyl group-containing polymer compound, a metal alkoxide, a metal alkoxide hydrolysate, and a metal alkoxide polymer.

18. A wavelength conversion sheet comprising a phosphor layer that contains quantum dot phosphors, and one or more of the phosphor protective films of claim 12 laminated on at least one surface of the phosphor layer.

19. The wavelength conversion sheet of claim 18, wherein the phosphor protective film is laminated so that the first base material of the barrier film faces the phosphor layer.

20. The wavelength conversion sheet of claim 19, wherein:

the phosphor protective film includes a coating layer that improves optical properties; and the coating layer is provided on a surface of the plastic film, the surface of the plastic film being opposite to a surface that faces the phosphor layer.

21. A backlight unit comprising a light source, a light guide plate, and the wavelength conversion sheet of claim 19.

22. The wavelength conversion sheet of claim 18, wherein the phosphor protective film is laminated so that the plastic film faces the phosphor layer.

23. The wavelength conversion sheet of claim 22, wherein:

the phosphor protective film includes a coating layer having an optical function; and the coating layer is provided on a surface of the barrier film, the surface of the barrier film being opposite to a surface that faces the phosphor layer.

* * * * *